United States Patent
Wang et al.

(10) Patent No.: US 9,866,240 B2
(45) Date of Patent: Jan. 9, 2018

(54) MAP ALGORITHM-BASED TURBO DECODING METHOD AND APPARATUS, AND COMPUTER STORAGE MEDIUM

(71) Applicant: Sanechips Technology Co., Ltd., Shenzhen (CN)

(72) Inventors: Xi Wang, Shenzhen (CN); Ning Qiu, Shenzhen (CN); Nanshan Cao, Shenzhen (CN)

(73) Assignee: SANECHIPS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 15/322,331

(22) PCT Filed: Sep. 15, 2014

(86) PCT No.: PCT/CN2014/086524
§ 371 (c)(1),
(2) Date: Dec. 27, 2016

(87) PCT Pub. No.: WO2016/000321
PCT Pub. Date: Jan. 7, 2016

(65) Prior Publication Data
US 2017/0134042 A1  May 11, 2017

(30) Foreign Application Priority Data

Jun. 30, 2014  (CN) .......................... 2014 1 0307603

(51) Int. Cl.
*H03M 7/34*  (2006.01)
*H03M 7/30*  (2006.01)

(52) U.S. Cl.
CPC ..................................... *H03M 7/30* (2013.01)

(58) Field of Classification Search
CPC ................................. H03M 7/30; H03M 7/00
(Continued)

(56) References Cited

U.S. PATENT DOCUMENTS 6,813,743 B1 * 11/2004 Eidson ............. H03M 13/3972
375/341
7,107,509 B2 * 9/2006 Bickerstaff ....... H03M 13/2957
714/780

(Continued)

FOREIGN PATENT DOCUMENTS

| CN | 101777924 A | 7/2010 |
| CN | 101807971 A | 8/2010 |

(Continued)

OTHER PUBLICATIONS

International Search Report in international application No. PCT/CN2014/086524, dated Mar. 27, 2015.
(Continued)

*Primary Examiner* — Jean B Jeanglaude
(74) *Attorney, Agent, or Firm* — Oppedahl Patent Law Firm LLC

(57) ABSTRACT

An MAP algorithm-based Turbo decoding method and apparatus. The method includes: iteratively estimating an information symbol by using an MAP algorithm, acquiring an α and β window boundary values of each sliding window by means of window boundary value inheritance, acquiring an α block boundary value and β block boundary value of each sub-block by means of block boundary value inheritance, and recursively calculating posterior probability Log Likelihood Ratio (LLR) values of a whole window and a whole block according to the α boundary values and the β boundary values (101); and performing decoding decision according to the LLR values (102).

12 Claims, 5 Drawing Sheets

(58) Field of Classification Search
USPC ..... 341/50, 51; 375/262, 253, 341; 714/755, 714/752
See application file for complete search history.

(56) References Cited

U.S. PATENT DOCUMENTS

| | | | | |
|---|---|---|---|---|
| 7,849,377 | B2* | 12/2010 | Hekstra | H03M 13/2975 714/752 |
| 7,929,646 | B2* | 4/2011 | Chen | H03M 13/3723 375/253 |
| 8,321,744 | B2* | 11/2012 | Stein | H03M 13/2957 375/262 |
| 2006/0039509 | A1 | 2/2006 | Galili | |
| 2009/0019332 | A1* | 1/2009 | Hekstra | H03M 13/2975 714/752 |
| 2009/0172495 | A1* | 7/2009 | Wang | H03M 13/2957 714/755 |
| 2013/0198592 | A1 | 8/2013 | Wang | |

FOREIGN PATENT DOCUMENTS

| | | |
|---|---|---|
| CN | 102064838 A | 5/2011 |
| CN | 102571107 A | 7/2012 |
| CN | 102064838 * | 5/2015 |
| EP | 2621091 A1 | 7/2013 |
| WO | 2004028004 A2 | 4/2004 |

OTHER PUBLICATIONS

English Translation of the Written Opinion of the International Search Authority in international application No. PCT/CN2014/086524, dated Mar. 27, 2015.

Supplementary European Search Report in European application number: 14896707.8, dated on Aug. 11, 2017.

Matthias May et al: "A 150Mbit/s 3GPP LTE Turbo code decoder", 2010 Design, Automation & Test in Europe Conference & Exhibition: Dated 2010; Dresden, Germany, Mar. 8-12, 2010, IEEE, Piscataway, NJ, US, Mar. 8, 2010 (Mar. 8, 2010), pp. 1420-1425, XP032317892, DOI: 10.1109/DATE.2010.5457035 ISBN: 978-1-4244-7054-9.

Frederik Naessens et al: "A unified instruction set programmable architecture for multi-standard advanced forward error correction", Signal Processing Systems, 2008. SIPS 2008. IEEE Workshop on, IEEE, Discataway, NJ, USA. Oct. 8, 2008 (Oct. 8, 2008), pp. 31-36, XP031361162, ISBN:978-1-4244-2923-3.

* cited by examiner

MAP ALGORITHM-BASED TURBO DECODING METHOD AND APPARATUS, AND COMPUTER STORAGE MEDIUM

TECHNICAL FIELD

The disclosure relates to the technical field of communications, and in particular to a Maximum A Posteriori (MAP) algorithm-based Turbo decoding method and apparatus, and a computer storage medium.

BACKGROUND

In the international communication conference held at Geneva, Switzerland in 1993, C. Berrou, A. Glavieux and P. Thitimajshiwa from the British Communications University of France firstly proposed an encoding/decoding scheme referred to as a Turbo code. It is realized by combining two Recursive Systematic Convolutional (RSC) codes in a parallel cascading manner via an interleaver. This scheme adopts an iterative feedback decoding mode, truly explores a potential of cascaded codes, and breaks through a minimum distance short-code design idea in a random-like coding/decoding scheme, thereby making it more approach an ideal random code performance. Some existing communication systems such as a 3GPP LTE/LTE-A system, a WCDMA system and a TD-SCDMA system use Turbo codes for channel encoding.

The Turbo code has the characteristics of random-like codes, and also has sufficient structural information, which makes it possible to be decoded by using an efficient iterative decoding method. Due to these characteristics, the Turbo code has extremely beneficial performances under the conditions of a moderate bit error rate and a long packet length particularly. Actually, when any code rate and information packet length are greater than 104 bits, if a signal-to-noise ratio is within a Shannon limit 1 dB, the Turbo code using an iterative decoding algorithm can reach a bit error rate of 10-5, that is, an Eb/N0 value under this code rate reaches a channel capacity.

The basic principle of Turbo decoding lies in iterative estimation of an information symbol based on an MAP algorithm, and inputting gradually updated prior information obtained by all pieces of statistically independent information after the previous decoding iteration. An iterative decoding concept is very similar to negative feedback, output external information is fed back to an input end to achieve an effect of amplifying the signal-to-noise ratio of the input end, thus stabilizing system output. By means of sufficient iterations, a final decoding decision may be obtained from a posterior probability Log Likelihood Ratio (LLR) value of any one decoder.

Most of the current MAP decoding schemes reduce the decoding delay and improve the throughput by using a decoding structure consisting of sub-blocks and sliding windows. In order to obtain more accurate boundary values, an existing method pre-calculates a part of overlap as a track back length. Under the restriction of the overlap length, this method is complicated in implementation and severe in performance degradation under high code rate, and the proportion of effective decoding time of each sub-block is low.

SUMMARY

In view of this, the embodiment of the disclosure is intended to provide an MAP algorithm-based Turbo decoding method, an information symbol being sequentially divided into a plurality of sub-blocks, each sub-block including a plurality of sliding windows. The method may include: iteratively estimating an information symbol by using an MAP algorithm, acquiring $\alpha$ and $\beta$ boundary values for each sliding window and each sub-block by means of window boundary value inheritance and block boundary value inheritance, and recursively calculating posterior probability Log Likelihood Ratio (LLR) values of a whole window and a whole block according to the $\alpha$ and $\beta$ boundary values; and performing decoding decision according to the LLR values.

The acquiring an $\alpha$ boundary value for a sliding window by means of window boundary value inheritance and block boundary value inheritance may include: taking an $\alpha$ boundary value, acquired in a previous iteration, as an initial value of $\alpha$ in a present iteration, forwardly reading input data of the whole window of the sliding windows, and calculating an $\alpha$ value of the whole window.

Acquiring a $\beta$ boundary value for a sliding window by means of window boundary value inheritance and block boundary value inheritance may include: taking a $\beta$ boundary value, acquired in the previous iteration, as an initial value of $\beta$ in the present iteration, reversely reading the input data of the whole window of the sliding windows, and calculating a $\beta$ value of the whole window.

A Random Access Memory (RAM) array for storing the input data comprises two RAMs, configured to implement continuous calculation by means of a ping-pong operation.

In order to calculate $\beta$ values, write and read addresses of the RAMs for storing the input data may range from 0 to K-1 and range from K-1 to 0 respectively, where K is a data length of a window.

The $\beta$ values calculated for all the sliding windows may be stored in the RAMs, and the write and read addresses may range from K to 0 and range from 1 to K respectively, where K is a data length of a window.

For a first sliding window in a first sub-block, a first preset value is taken as the initial value of $\alpha$, and for the first sliding window in a non-first sub-block, the $\alpha$ boundary value calculated for a last sliding window in a previous sub-block is inherited as the initial value of $\alpha$ to be updated in a present sub-block; and for the last sliding window in a last sub-block, a second preset value is taken as the initial value of $\beta$, and for the last sliding window in the non-last sub-block, the $\beta$ boundary value calculated for the first sliding window in a subsequent sub-block is inherited as the initial value of $\beta$ to be updated in the present sub-block.

The embodiment of the disclosure provides an MAP algorithm-based Turbo decoding apparatus. The apparatus may include: a first processing module and a second processing module. The first processing module is configured to iteratively estimate an information symbol by using an MAP algorithm, acquire $\alpha$ and $\beta$ boundary values for each sliding window and each sub-block by means of window boundary value inheritance and block boundary value inheritance, and recursively calculate posterior probability Log Likelihood Ratio (LLR) values of $\alpha$ whole window and a whole block according to the $\alpha$ and $\beta$ boundary values; and the second processing module is configured to perform decoding decision according to the LLR values.

The first processing module may be specifically configured to: take an $\alpha$ boundary value, acquired in a previous iteration, as an initial value of $\alpha$ in a present iteration, forwardly read input data of the whole window of the sliding windows, and calculate an $\alpha$ value of the whole window; and take a $\beta$ boundary value, acquired in the previous iteration, as an initial value of β in the present iteration, reversely read the input data of the whole window of the sliding windows, and calculate a β value of the whole window.

The apparatus may further include a first storage module, configured to store the input data by means of a Random Access Memory (RAM) array comprising two RAMs, so as to implement continuous calculation by means of a ping-pong operation.

In order to calculate β values, write and read addresses of the RAMs for storing the input data may range from 0 to K−1 and range from K−1 to 0 respectively, where K is a data length of a window.

The apparatus may further include a second storage module, configured to store the β values calculated for all the sliding windows, the write and read addresses ranging from K to 0 and ranging from 1 to K respectively, where K is a data length of a window, and the β window boundary value acquired after calculation for a whole window is stored at a zero position.

The first processing module is configured to: for a first sliding window in a first sub-block, take a first preset value as an initial value of α, and for the first sliding window in a non-first sub-block, inherit an α boundary value calculated for the last sliding window in the previous sub-block as an initial value of α to be updated in the present sub-block; and for the last sliding window in a last sub-block, take a second preset value as an initial value of β, and for the last sliding window in the non-last sub-block, inherit a β boundary value calculated for the first sliding window in a subsequent sub-block as the initial value of β to be updated in the present sub-block.

The embodiment of the disclosure also provides a computer storage medium. Computer executable instructions may be stored therein. The computer executable instructions may be configured to execute the above method.

The embodiment of the disclosure provides an MAP algorithm-based Turbo decoding method and apparatus, and a computer storage medium. An information symbol is iteratively estimated by using an MAP algorithm, an α boundary value and β boundary value for each sliding window and an α boundary value and β boundary value for each sub-block are acquired by means of window boundary value inheritance and block boundary value inheritance, and LLR values of a whole window and a whole block are recursively calculated according to the α boundary values and the β boundary values; and decoding decision is performed according to the LLR values. According to the technical solutions of the embodiment of the disclosure, it is unnecessary to pre-calculate initial α and β states of each sub-block by using overlap, and it is also unnecessary to pre-calculate initial α and β states by using overlap of each sliding window, thereby resulting in a simple implementation structure, and prolonging effective decoding time of each sub-block.

DETAILED DESCRIPTION

In various embodiments of the disclosure, an α boundary value and β boundary value of each sliding window are acquired by means of window boundary value inheritance.

Figure 1:
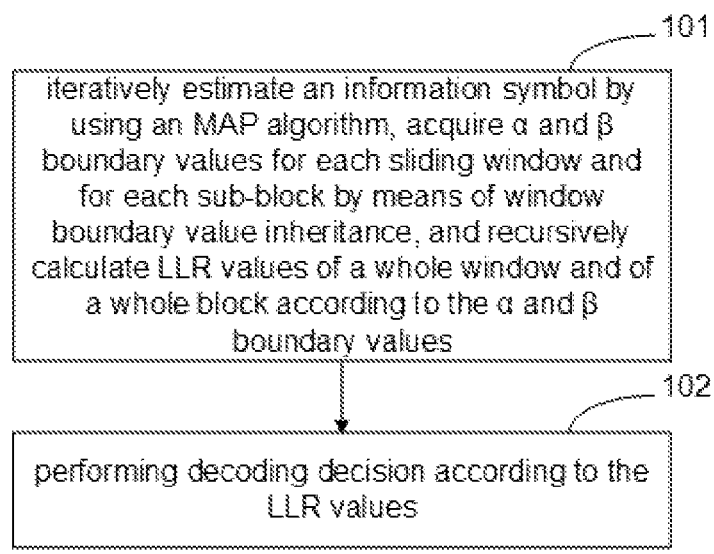
FIG. 1 is a flowchart of an MAP algorithm-based Turbo decoding method according to an embodiment of the disclosure.

In order to deal with performance degradation of an MAP algorithm with overlap at a high code rate and complicated structure for implementing the algorithm, an embodiment of the disclosure provides an MAP algorithm-based Turbo decoding method. As shown in FIG. 1, the method includes the following steps.

Step 101: An information symbol is iteratively estimated by using an MAP algorithm, an α boundary value and β boundary value of each sliding window and an α boundary value and β boundary value of each sub-block are acquired by means of window boundary value inheritance, and LLR values of a whole window and a whole block are recursively calculated according to the α boundary values and the β boundary values.

In the embodiment of the disclosure, the information symbol is sequentially divided into a plurality of sub-blocks, each sub-block including a plurality of sliding windows.

Step 102: Decoding decision is performed according to the LLR values.

Optionally, acquiring the α boundary values of the sliding windows by means of the window boundary value inheritance includes: taking an α boundary value, acquired in a previous iteration, as an initial value of α in a present iteration, forwardly reading input data of the whole window of the sliding windows, and calculating an α value of the whole window.

Acquiring the β boundary values of the sliding windows by means of the window boundary value inheritance includes: taking a β boundary value, acquired in the previous iteration, as an initial value of β in the present iteration, reversely reading the input data of the whole window of the sliding windows, and calculating a β value of the whole window.

It is to be noted that the step of inheriting the α boundary values of the sliding windows is intended to ensure that an initial state for calculation of each recursive update of boundary values $\alpha_0$-$\alpha_7$ of each sliding window, along with increase of number of iterations, fully approaches a values $\alpha_0$-$\alpha_7$ corresponding to an original MAP decoding structure without sub-blocks and sliding windows, and the step of inheriting the β boundary values of the sliding windows is intended to ensure that an initial state for calculation of each recursive update of boundary values $\beta_0$-$\beta_7$ of each sliding window, along with increase of the number of iterations, fully approaches corresponding $\beta$ values (ensuring that relative relationships of $\beta_0$-$\beta_7$ are consistent) in the original MAP decoding structure without the sub-blocks and the sliding windows.

Here, the boundary values $\beta_0$-$\beta_7$ of each sliding window $\beta$ are stored in an RAM as initial values of the corresponding sliding windows $\beta$ in a subsequent iteration. Based on a recursive $\beta$ calculation process, it is necessary to store input data (system bits, check bits, and prior information) of a whole window of each sliding window in the RAMs, and then to calculate a $\beta$ value of the whole window by reverse reading. Write and read addresses of the RAMs for storing the input data range from 0 to K−1 and range from K−1 to 0 respectively, where K is a data length of a window.

Optionally, an RAM array storing the input data includes two RAMs, so as to implement continuous calculation by means of a ping-pong operation. Here, in order to facilitate pipelined storage of the input data (system bits, check bits, and prior information) and continuous calculation of $\alpha$ and LLR, it requires two RAMs to execute an access operation (ping-pong operation).

Optionally, in order to calculate $\beta$ values, write and read addresses of the RAMs storing the input data may range from 0 to K−1 and range from K−1 to 0 respectively, where K is a data length of a window.

Optionally, the $\beta$ values calculated for all the sliding windows may be stored in the RAMs, the write and read addresses may range from K to 0 and range from 1 to K respectively, where K is a data length of a window, and a $\beta$ window boundary value acquired by calculating a window is stored at a zero position.

Optionally, for the first sliding window in the first sub-block, an initial value of $\alpha$ is a first preset value, and for the first sliding window in the non-first sub-block, an $\alpha$ boundary value calculated for the last sliding window in the previous sub-block is inherited as an initial value of $\alpha$ to be updated in the present sub-block; and for the last sliding window in the last sub-block, an initial value of $\beta$ is a second preset value, and for the last sliding window in the non-last sub-block, a $\beta$ boundary value calculated for the first sliding window in the subsequent sub-block is inherited as an initial value of $\beta$ to be updated in the present sub-block.

It is to be noted that the step of inheriting inter-block $\alpha$ and $\beta$ boundary values is intended to ensure that regarding an initial state for calculating $\alpha$ and $\beta$ of each sub-block through each recursive update, along with increase of the number of iterations, it fully approaches a relative relationship of eight states of corresponding $\alpha$ values $\alpha_0$-$\alpha_7$ and a relative relationship of eight states of corresponding $\beta$ values $\beta_0$-$\beta_7$ in the original MAP decoding structure without the sub-blocks and the sliding windows. After calculation of the sliding windows is ended, boundary values of sub-blocks are stored, and inherited to a subsequent iteration as an initial value corresponding to each sub-block.

For example, the step of implementing inter-block $\alpha$ inheritance may include: inheriting $\alpha$ boundary values $\alpha_0$-$\alpha_7$ calculated for the last sliding window in the previous sub-block as an initial state of $\alpha$ to be updated in the present sub-block. For the initial value of $\alpha$ for the first sub-block, each iteration is [0, INF, INF, INF, INF, INF, INF, INF], where INF represents minus infinity.

For example, the step of implementing inter-block $\beta$ inheritance may include: inheriting $\beta$ boundary values $\beta_0$-$1_7$ calculated for the first sliding window in the subsequent sub-block as an initial state of $\alpha$ to be updated in the present sub-block. For the initial value of $\beta$ for the last sub-block, each iteration is [0, INF, INF, INF, INF, INF, INF, INF], where INF represents minus infinity.

In the embodiment of the disclosure, the initial value of $\alpha$ for each sub-block is obtained by inter-block inheritance. Since a is sequentially calculated, during calculation of $\alpha$ for each sliding window, it may be acquired just from the boundary value of the previous sliding window, without the need of inheriting a state value of the previous iteration. During calculation of $\beta$ for each sliding window, it is necessary to inherit the window boundary value of the previous iteration.

Figure 2:
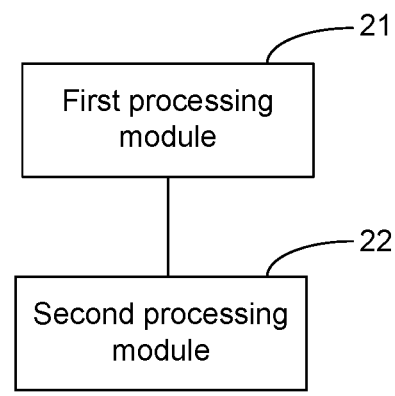
FIG. 2 is a structural diagram of an MAP algorithm-based Turbo decoding apparatus according to an embodiment of the disclosure.

Correspondingly, the embodiment of the disclosure also provides an MAP algorithm-based Turbo decoding apparatus. As shown in FIG. 2, the apparatus includes: a first processing module 21 and a second processing module 22.

The first processing module 21 is configured to iteratively estimate an information symbol by using an MAP algorithm, acquire an $\alpha$ boundary value and $\beta$ boundary value for each sliding window by means of window boundary value inheritance, acquire an $\alpha$ boundary value and $\beta$ boundary value for each sub-block by means of block boundary value inheritance, and recursively calculate LLR values of a whole window and a whole block according to the $\alpha$ boundary values and the $\beta$ boundary values.

The second processing module 22 is configured to perform decoding decision according to the LLR values.

Optionally, the first processing module 21 is specifically configured to: take an $\alpha$ boundary value, acquired in a previous iteration, as an initial value of $\alpha$ in a present iteration, forwardly read input data of the whole window of the sliding windows, and calculate an $\alpha$ value of the whole window; and take a $\beta$ boundary value, acquired in the previous iteration, as an initial value of $\beta$ in the present iteration, reversely read the input data of the whole window of the sliding windows, and calculate a $\beta$ value of the whole window.

Figure 3:
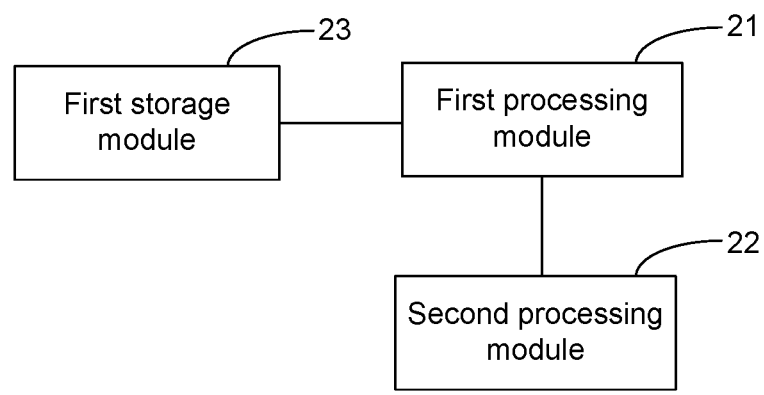
FIG. 3 is a structural diagram of another MAP algorithm-based Turbo decoding apparatus according to an embodiment of the disclosure.

Optionally, as shown in FIG. 3, the apparatus further includes a first storage module 23, configured to store the input data by means of an RAM array including two RAMs, so as to implement continuous calculation by means of a ping-pong operation.

Optionally, in order to calculate $\beta$ values, write and read addresses of the RAMs storing the input data may range from 0 to K−1 and range from K−1 to 0 respectively, where K is a data length of a window.

Figure 4:
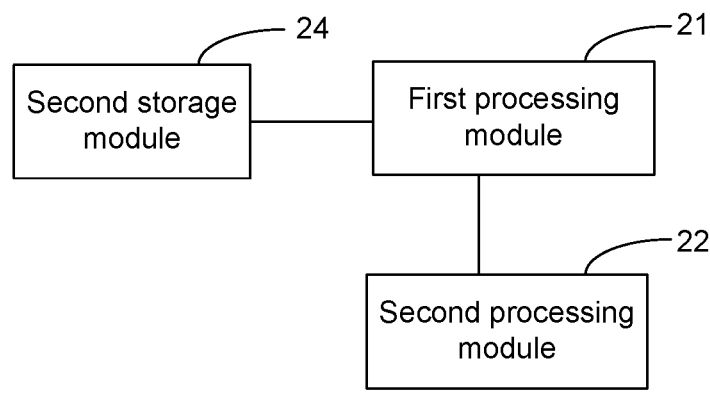
FIG. 4 is a structural diagram of another MAP algorithm-based Turbo decoding apparatus according to an embodiment of the disclosure.

Optionally, as shown in FIG. 4, the apparatus further includes a second storage module 24, configured to store the $\beta$ values calculated for all the sliding windows, the write and read addresses may range from K to 0 and range from 1 to K respectively, where K is a data length of a window, and a $\beta$ window boundary value acquired after calculation for a whole window is stored at a zero position.

Optionally, the first processing module 21 is specifically configured to: for the first sliding window in the first sub-block, take a first preset value as an initial value of $\alpha$, and inherit an $\alpha$ boundary value calculated at the last sliding window in the previous sub-block as an initial value of $\alpha$ to be updated in the present sub-block for the first sliding window in the non-first sub-block; and acquire a second preset value serving as an initial value of $\beta$ for the last sliding window in the last sub-block, and inherit a $\beta$ boundary value calculated for the first sliding window in the subsequent sub-block as an initial value of $\beta$ to be updated in the present sub-block for the last sliding window in the non-last sub-block.

The embodiment of the disclosure also provides a computer storage medium. Computer executable instructions are stored therein. The computer executable instructions are configured to execute the above method.

The technical solutions of the disclosure will be further elaborated below by means of specific embodiments.

Embodiment 1

Figure 5:
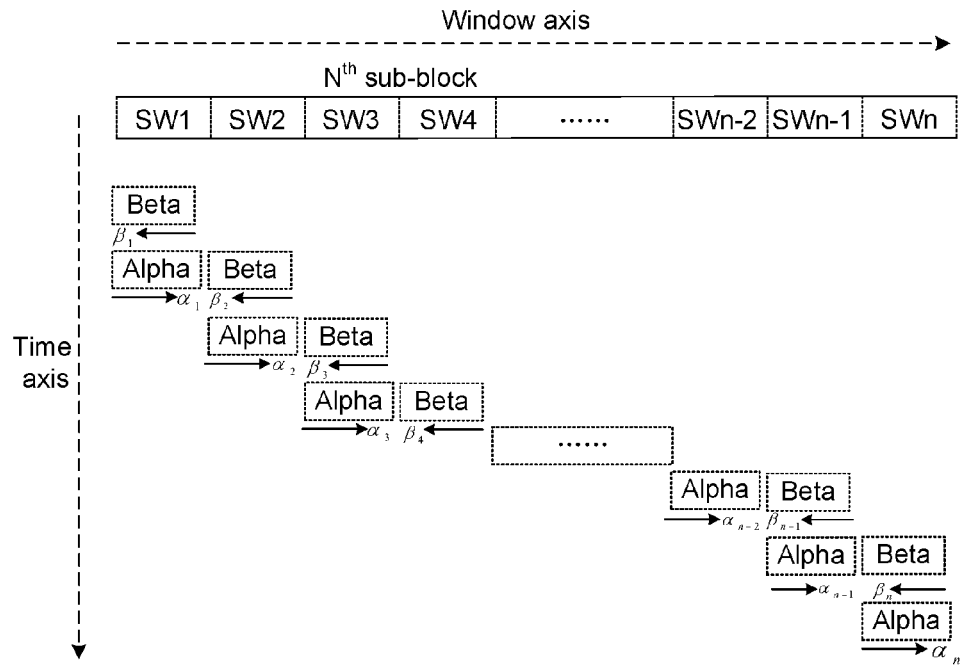
FIG. 5 is a pipelined calculation flowchart of a boundary value-inherited sliding window provided by an embodiment 1 of the disclosure.

FIG. 5 is a pipelined calculation flowchart of a boundary value-inherited sliding window provided by an embodiment 1 of the disclosure. As shown in FIG. 5, the flow includes the following steps.

In a first time window, input data (information bit Ys, check bit Yp and prior information La) of a window length LEN of a sliding window is stored in an RAM array; in a second time window, Ys, Yp and La are read from the RAM array, and β1 is calculated and stored in the RAM, where β1 represents a β value of a whole window of a first sliding window; and in a third time window, Ys, Yp and La are read from the RAM array, α1 and β2 are calculated and stored in the RAM array, and so on until α and β of the last sliding window of this sub-block are calculated.

Here, the RAM array storing the input data (information bit Ys, check bit Yp and prior information La) includes two RAMs of which the sizes are equal to the window length LEN, namely RAM(0) and RAM(1).

In an input data RAM address generation module, write address of RAM(0) and RAM(1) are addr(i)=0, 1, 2, ..., LEN, a read address of α is addr(j)=0, 1, 2, ..., LEN, and a read address of β is addr(k), k=LEN, LEN−1, LEN−2, ..., 3, 2, 1.

Figure 6:
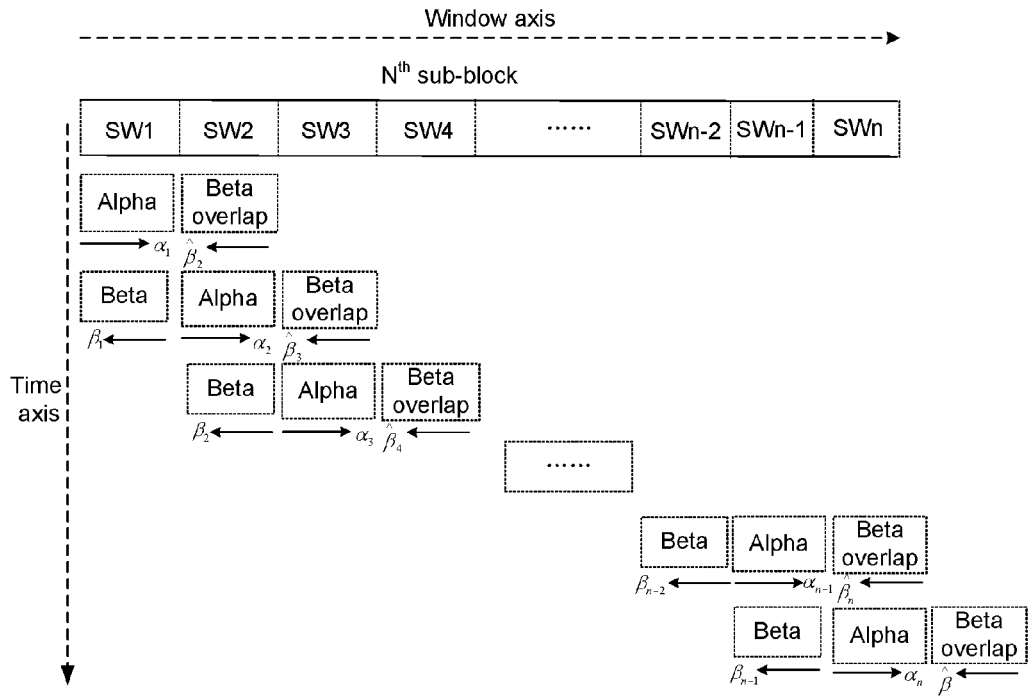
FIG. 6 is a traditional pipelined calculation flowchart of a sliding window with a window boundary value calculated by means of overlap.

Compared with a traditional pipelined calculation flow of a sliding window with a window boundary value calculated by means of overlap shown in FIG. 6 (where, overlap of the last window comes from overlap provided by a subsequent sub-block header), the embodiment of the disclosure does not need to pre-calculate initial states of α and β of each sub-block by using overlap, thereby resulting in a simple implementation structure.

Embodiment 2

Figure 7:
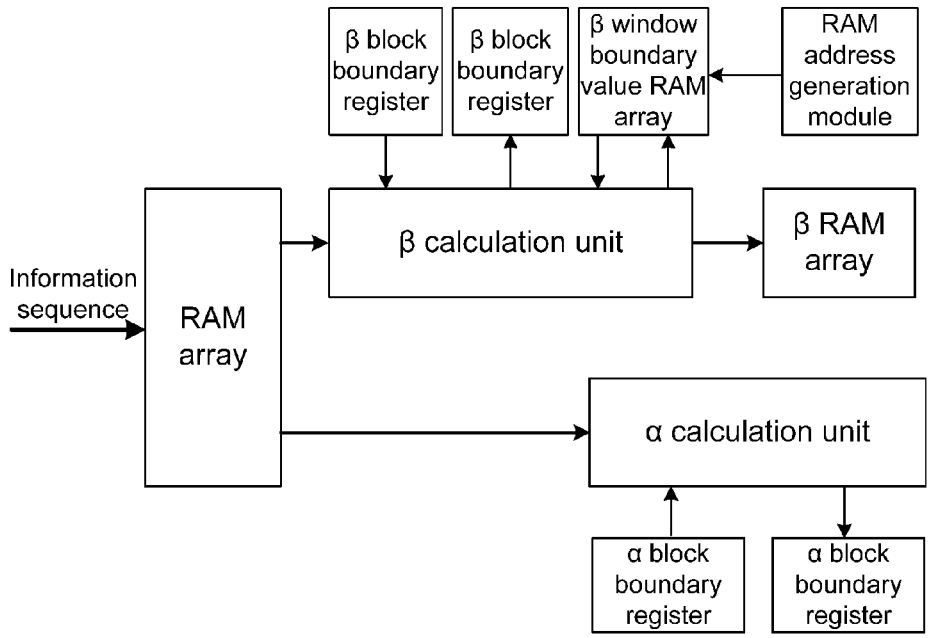
FIG. 7 is a structural diagram of a boundary condition-inherited Turbo code MAP calculation unit provided by an embodiment 2 of the disclosure.

FIG. 7 is a structural diagram of a boundary condition-inherited Turbo code MAP calculation unit provided by an embodiment 2 of the disclosure. Based on the structure shown in FIG. 7, in this embodiment, preset block and window boundary values serve as initial states to complete first dual-iteration. As for a sub-block 1, an initial value of α is a constant:

[0, INF, INF, INF, INF, INF, INF, INF]; and as for a sub-block n, an initial value of β is also a constant:

[0, INF, INF, INF, INF, INF, INF, INF]. An initial value of each window boundary value is used for the first iteration, eight states $\alpha_0$-$\alpha_7$ and $\beta_0$-$\beta_7$ of α and β are equally probable in default. Specifically, $$\alpha_{initial}=[0,0,0,0,0,0,0,0], \beta_{initial}=[0,0,0,0,0,0,0,0]$$

In an $i^{th}$ (i>1) iteration, a window boundary value of β is read by the RAM array storing β, and block boundary values of α and β are obtained by reading corresponding registers.

The RAM array storing β includes two RAMs of which the sizes are equal to the window length LEN, namely $RAM_\beta(0)$ and $RAM_\beta(1)$.

In an RAM address generation hardware module storing β, write addresses of $RAM_\beta(0)$ and $RAM_\beta(1)$ are addr(i), i=LEN, LEN−1, LEN−2, ..., 1, 0, and read addresses of $RAM_\beta(0)$ and $RAM_\beta(1)$ are addr(j)=0 1 2 ..., LEN.

Figure 8:
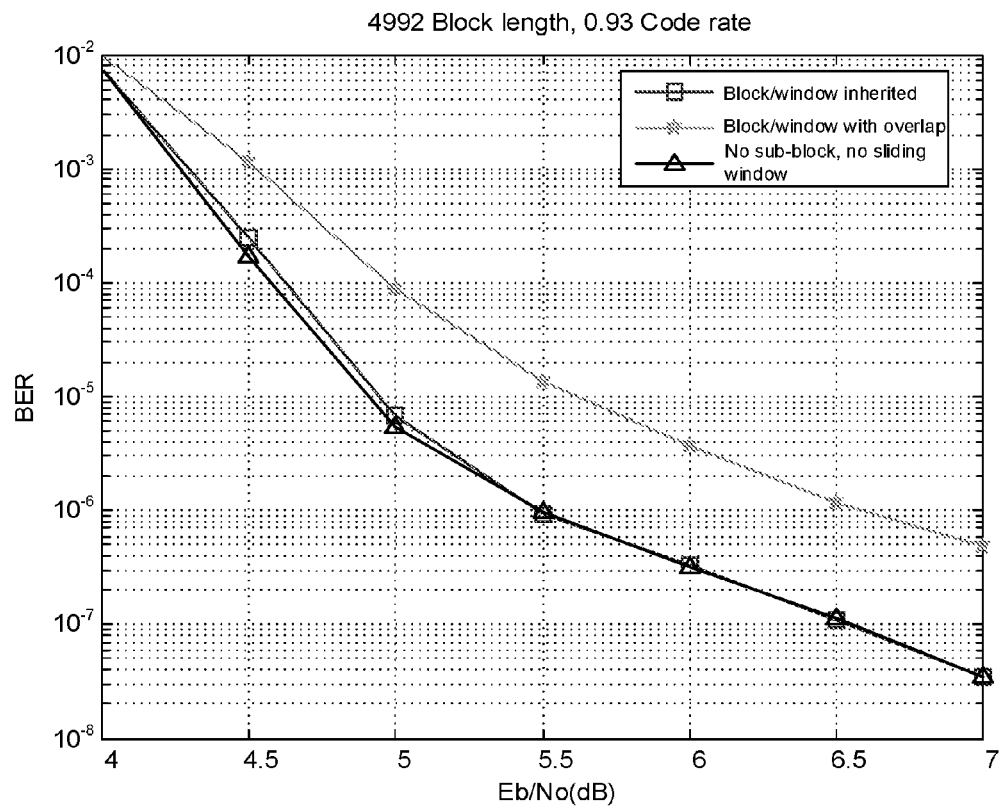
FIG. 8 is a schematic diagram of decoding performances of a Turbo decoder with an inherited block boundary value and window boundary value in an embodiment 2 of the disclosure.

As shown in FIG. 8, under the conditions of a 4992-block-length, an SF-MAX-Log-MAP algorithm, an LTE interleaver, an AWGN channel, SF=0.75, and a 0.93-code-rate, decoding performances of a Turbo decoder with an inherited block boundary value and an inherited window boundary value approach an original serial no-sliding-window decoding performance, while the solution with overlap has a significant performance degradation at a high code rate.

Figure 9:
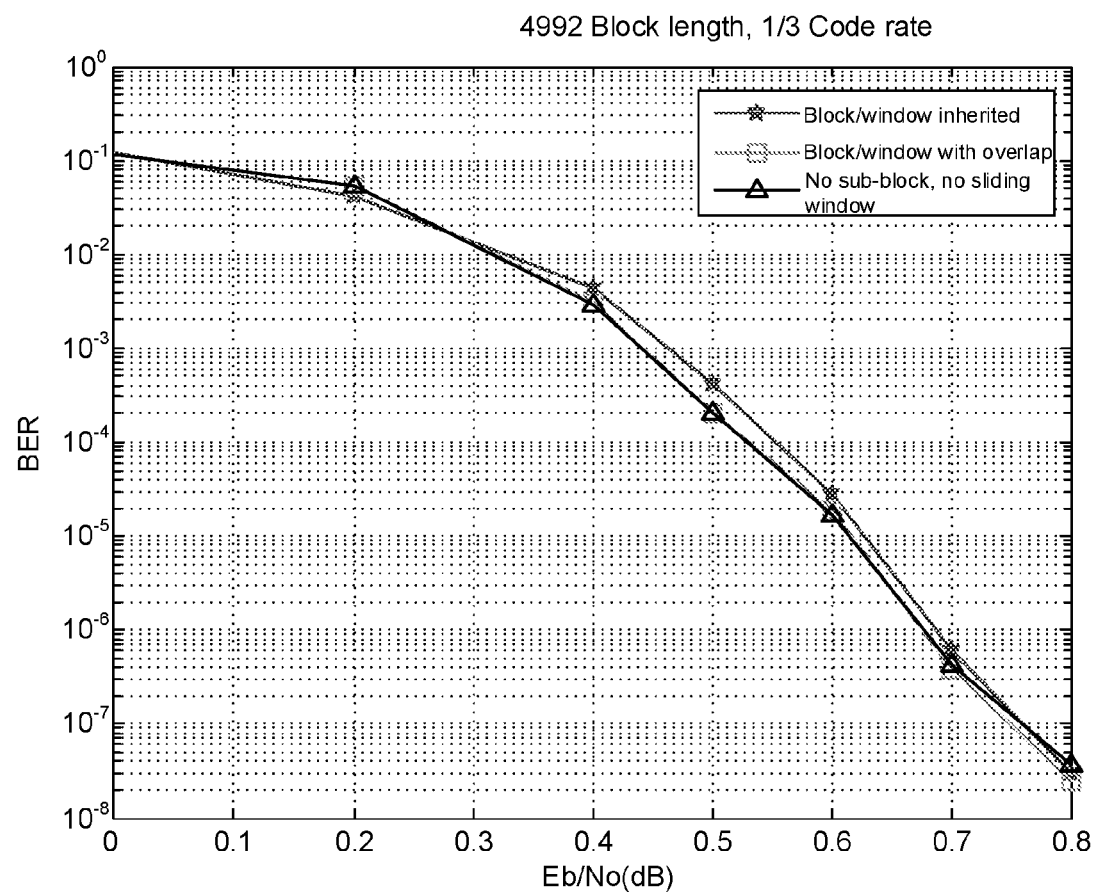
FIG. 9 is a schematic diagram of decoding performances of a Turbo decoder with an inherited block boundary value and window boundary value in an embodiment 2 of the disclosure.

As shown in FIG. 9, under the conditions of a 4992-block-length, an SF-MAX-Log-MAP algorithm, an LTE interleaver, an AWGN channel, SF=0.75, and a-1/3-code-rate, decoding performances of a Turbo decoder with an inherited block boundary value and an inherited window boundary value approach a solution with overlap and a serial no-sliding-window decoding performance.

According to the above description, the solutions of the embodiments of the disclosure have the following beneficial effects.

(1) α and β of sub-blocks and sliding windows may be directly calculated, and there is no need to pre-calculate initial states of α and β of each sub-block by using overlap or pre-calculate initial states of α and β by using overlap of each sliding window, thereby resulting in a simple implementation structure.

(2) An RAM prepared for storing input data (system bits, check bits and prior information) for calculation of overlap is not needed (as shown in FIG. 1 of the description). The storage space of an RAM of which the size is equal to two window lengths is saved (here, overlap is equal to a window length in default, and due to a ping-pong operation, two RAMs are required for alternative reading and writing). The resource occupation is low, and technical supports are provided to reduce the chip area and the manufacturing cost.

(3) As for each sub-block, calculation of two windows of overlap needed for calculation of a block boundary value is eliminated, thereby prolonging the effective decoding time of each sub-block (as shown in FIG. 2 of the description). For example, if a sub-block length is 1536 and each window has a length of 128, the effective decoding time of a traditional method accounts for 75% of the total decoding time, and the effective decoding time of the disclosure accounts for 85.71% of the total decoding time.

(4) Conventionally, in order to deal with decoding performance degradation at a high perforation rate, overlap is lengthened, but this will accordingly increase the occupied storage space of an RAM and will cause the proportion of the effective decoding time of each sub-block to the total decoding time to be smaller. Along with increase of number of iterations, the method of the disclosure makes a relative relationship of eight states $\alpha_0$-$\alpha_7$ and $\beta_0$-$\beta_7$ of each window boundary value fully approach an original MAP situation without sub-blocks and sliding windows, and the overhead of an additional RAM is not increased.

Each of the above units may be implemented by a Central Processing Unit (CPU), a Digital Signal Processor (DSP) or a Field-Programmable Gate Array (FPGA) in an electronic device.

Those skilled in the art shall understand that the embodiments of the disclosure may be provided as a method, a system or a computer program product. Thus, forms of hardware embodiments, software embodiments or embodiments integrating software and hardware may be adopted in the disclosure. Moreover, a form of the computer program product implemented on one or more computer available storage media (including, but are not limited to, a disk memory, an optical memory and the like) containing computer available program codes may be adopted in the disclosure.

The disclosure is described with reference to flow charts and/or block diagrams of the method, the device (system) and the computer program product according to the embodiments of the disclosure. It will be appreciated that each flow and/or block in the flow charts and/or the block diagrams and a combination of the flows and/or the blocks in the flow charts and/or the block diagrams may be implemented by computer program instructions. These computer program instructions may be provided for a general computer, a dedicated computer, an embedded processor or processors of other programmable data processing devices to generate a machine, such that an apparatus for implementing functions designated in one or more flows of the flow charts and/or one or more blocks of the block diagrams is generated via instructions executed by the computers or the processors of the other programmable data processing devices.

These computer program instructions may also be stored in a computer readable memory capable of guiding the computers or the other programmable data processing devices to work in a specific mode, such that a manufactured product including an instruction apparatus is generated via the instructions stored in the computer readable memory, and the instruction apparatus implements the functions designated in one or more flows of the flow charts and/or one or more blocks of the block diagrams.

These computer program instructions may also be loaded to the computers or the other programmable data processing devices, such that processing implemented by the computers is generated by executing a series of operation steps on the computers or the other programmable devices, and therefore the instructions executed on the computers or the other programmable devices provide a step of implementing the functions designated in one or more flows of the flow charts and/or one or more blocks of the block diagrams.

The above is only the preferred embodiments of the disclosure and not intended to limit the scope of protection of the disclosure.

What is claimed is:

1. A Maximum A Posteriori (MAP) algorithm-based Turbo decoding method, an information symbol being sequentially divided into a plurality of sub-blocks, each sub-block comprising a plurality of sliding windows, the method comprising:

iteratively estimating an information symbol by using an MAP algorithm, acquiring $\alpha$ and $\beta$ boundary values for each sliding window and each sub-block by means of window boundary value inheritance and block boundary value inheritance, and recursively calculating posterior probability Log Likelihood Ratio (LLR) values of a whole window and a whole block according to the $\alpha$ and $\beta$ boundary values; and performing decoding decision according to the LLR values, wherein acquiring an $\alpha$ boundary value for a sliding window by means of window boundary value inheritance and block boundary value inheritance comprises:

taking an $\alpha$ boundary value, acquired in a previous iteration, as an initial value of $\alpha$ in a present iteration, forwardly reading input data of the whole window of the sliding windows, and calculating an $\alpha$ value of the whole window; and acquiring a $\beta$ boundary value for a sliding window by means of window boundary value inheritance and block boundary value inheritance comprises:

taking a $\beta$ boundary value, acquired in the previous iteration, as an initial value of $\beta$ in the present iteration, reversely reading the input data of the whole window of the sliding windows, and calculating a $\beta$ value of the whole window, and wherein in order to calculate $\beta$ values, write and read addresses of a RAM for storing the input data range from 0 to K−1 and range from K−1 to 0 respectively, where K is a data length of a window.

2. The method according to claim 1, wherein the $\beta$ values calculated for all the sliding windows are stored in the RAMs, and the write and read addresses range from K to 0 and range from 1 to K respectively, where K is a data length of a window.

3. The method according to claim 1, wherein a Random Access Memory (RAM) array for storing the input data comprises two RAMs, configured to implement continuous calculation by means of a ping-pong operation.

4. The method according to claim 1, wherein for a first sliding window in a first sub-block, a first preset value is taken as the initial value of $\alpha$, and for the first sliding window in a non-first sub-block, the $\alpha$ boundary value calculated for a last sliding window in a previous sub-block is inherited as the initial value of $\alpha$ to be updated in a present sub-block; and for the last sliding window in a last sub-block, a second preset value is taken as the initial value of $\beta$, and for the last sliding window in the non-last sub-block, the $\beta$ boundary value calculated for the first sliding window in a subsequent sub-block is inherited as the initial value of $\beta$ to be updated in the present sub-block.

5. A Maximum A Posteriori (MAP) algorithm-based Turbo decoder, comprising:

a processor; and a memory, having stored therein instructions that, when executed by a processor, causes the processor to perform an MAP algorithm-based Turbo decoding method, the method comprising:

iteratively estimating an information symbol by using an MAP algorithm, acquiring $\alpha$ and $\beta$ boundary values for each sliding window and each sub-block by means of window boundary value inheritance and block boundary value inheritance, and recursively calculating posterior probability Log Likelihood Ratio (LLR) values of a whole window and a whole block according to the $\alpha$ and $\beta$ boundary values; and performing decoding decision according to the LLR values, wherein acquiring $\alpha$ and $\beta$ boundary values for each sliding window and each sub-block by means of window boundary value inheritance and block boundary value inheritance comprises: taking an $\alpha$ boundary value, acquired in a previous iteration, as an initial value of $\alpha$ in a present iteration, forwardly reading input data of the whole window of the sliding windows, and calculating an $\alpha$ value of the whole window; and taking a $\beta$ boundary value, acquired in the previous iteration, as an initial value of $\beta$ in the present iteration, reversely reading the input data of the whole window of the sliding windows, and calculating a $\beta$ value of the whole window, and wherein in order to calculate $\beta$ values, write and read addresses of a RAM for storing the input data range from 0 to K−1 and range from K−1 to 0 respectively, where K is a data length of a window.

6. The decoder according to claim 5, further comprising a first storage, configured to store the input data by means of a Random Access Memory (RAM) array comprising two RAMs, so as to implement continuous calculation by means of a ping-pong operation.

7. The decoder according to claim 5, further comprising a second storage, configured to store the β values calculated for all the sliding windows, the write and read addresses ranging from K to 0 and ranging from 1 to K respectively, where K is a data length of a window, and the β window boundary value acquired after calculation for a whole window is stored at a zero position.

8. The decoder according to claim 5, wherein acquiring α and β boundary values for each sliding window and each sub-block by means of window boundary value inheritance and block boundary value inheritance comprises: for a first sliding window in a first sub-block, taking a first preset value as an initial value of α, and for the first sliding window in a non-first sub-block, inheriting an α boundary value calculated for the last sliding window in the previous sub-block as an initial value of α to be updated in the present sub-block; and for the last sliding window in a last sub-block, taking a second preset value as an initial value of β, and for the last sliding window in the non-last sub-block, inheriting a β boundary value calculated for the first sliding window in a subsequent sub-block as the initial value of β to be updated in the present sub-block.

9. A non-transitory computer storage medium, storing computer executable instructions for executing a Maximum A Posteriori (MAP) algorithm-based Turbo decoding method, an information symbol being sequentially divided into a plurality of sub-blocks, each sub-block comprising a plurality of sliding windows, the method comprising:
iteratively estimating an information symbol by using an MAP algorithm, acquiring α and β boundary values for each sliding window and each sub-block by means of window boundary value inheritance and block boundary value inheritance, and recursively calculating posterior probability Log Likelihood Ratio (LLR) values of a whole window and a whole block according to the α and β boundary values; and
performing decoding decision according to the LLR values,
wherein acquiring an α boundary value for a sliding window by means of window boundary value inheritance and block boundary value inheritance comprises:
taking an α boundary value, acquired in a previous iteration, as an initial value of α in a present iteration, forwardly reading input data of the whole window of the sliding windows, and calculating an α value of the whole window; and
acquiring a β boundary value for a sliding window by means of window boundary value inheritance and block boundary value inheritance comprises:
taking a β boundary value, acquired in the previous iteration, as an initial value of β in the present iteration, reversely reading the input data of the whole window of the sliding windows, and calculating a β value of the whole window, and
wherein in order to calculate β values, write and read addresses of a RAM for storing the input data range from 0 to K−1 and range from K−1 to 0 respectively, where K is a data length of a window.

10. The non-transitory computer storage medium according to claim 9, wherein a Random Access Memory (RAM) array for storing the input data comprises two RAMs, configured to implement continuous calculation by means of a ping-pong operation.

11. The non-transitory computer storage medium according to claim 9, wherein the β values calculated for all the sliding windows are stored in the RAMs, and the write and read addresses range from K to 0 and range from 1 to K respectively, where K is a data length of a window.

12. The non-transitory computer storage medium according to claim 9, wherein
for a first sliding window in a first sub-block, a first preset value is taken as the initial value of α, and for the first sliding window in a non-first sub-block, the α boundary value calculated for a last sliding window in a previous sub-block is inherited as the initial value of α to be updated in a present sub-block; and
for the last sliding window in a last sub-block, a second preset value is taken as the initial value of β, and for the last sliding window in the non-last sub-block, the β boundary value calculated for the first sliding window in a subsequent sub-block is inherited as the initial value of β to be updated in the present sub-block.

* * * * *